United States Patent [19]

Tobita

[11] Patent Number: 4,571,509

[45] Date of Patent: Feb. 18, 1986

[54] OUTPUT CIRCUIT HAVING DECREASED INTERFERENCE BETWEEN OUTPUT TERMINALS

[75] Inventor: Youichi Tobita, Hyogo, Japan

[73] Assignee: Mitsubishi Denki Kabushiki Kaisha, Tokyo, Japan

[21] Appl. No.: 525,901

[22] Filed: Aug. 24, 1983

[30] Foreign Application Priority Data

Aug. 24, 1982 [JP] Japan .................................. 57-148064

[51] Int. Cl.[4] ........................................... H03K 19/094
[52] U.S. Cl. .................................... 307/443; 307/448;
307/473; 307/577; 307/304; 307/296 R
[58] Field of Search ............... 307/443, 448, 450, 453,
307/473, 549, 550, 575, 577, 584, 270, 304, 296
R, 297, 475, 264

[56] References Cited

U.S. PATENT DOCUMENTS

| 4,256,978 | 3/1981 | Pinckaers | 307/304 X |
| 4,296,340 | 10/1981 | Horan | 307/279 X |
| 4,345,172 | 8/1982 | Kobayashi et al. | 307/448 X |
| 4,378,506 | 3/1983 | Taira | 307/443 X |
| 4,395,645 | 7/1983 | Pernyeszi | 307/475 X |

OTHER PUBLICATIONS

Homan, "FET Depletion Load Push–Pull Logical Circuit", IBM Tech. Disc. Bull., vol. 18, No. 3, Aug. 1975, pp. 910–911.

Primary Examiner—Larry N. Anagnos
Assistant Examiner—D. R. Hudspeth
Attorney, Agent, or Firm—Sughrue, Mion, Zinn Macpeak & Seas

[57] ABSTRACT

An output circuit for a semiconductor integrated circuit is improved by reverse biasing the gates of non-selected output field effect transistors (MOSTs). A control MOST, when actuated by a chip-select signal, connects the gate of its associated output MOST with a negative voltage so that the non-selected output MOSTs are completely cut off. The invention avoids the problem which arises with the use of very short channel output MOSTs such that the channel cannot be completely cut off if a zero bias is applied to the gate.

8 Claims, 4 Drawing Figures

OUTPUT CIRCUIT HAVING DECREASED INTERFERENCE BETWEEN OUTPUT TERMINALS

BACKGROUND OF THE INVENTION

This invention relates to an output circuit for a semiconductor integrated circuit for use with a field-effect transistor (hereafter referred to as a MOST).

FIG. 1 shows a system in which the output terminals of two semiconductor integrated circuits are connected to conventional output circuits.

It is generally well known to connect terminals of a plurality of semiconductor integrated circuits, as shown, in common with one another and to use such common terminals as output terminals for such system.

In FIG. 1, numeral 10a designates the output circuit component for a first semiconductor integrated circuit A. At 1a and 2a are its output terminal and a terminal to which a power source (high level) voltage is applied. At 3a is a pull up MOST connected between the power source terminal and the output terminal 1a. At 4a is a pull down MOST connected between the output terminal 1a and ground. Numeral 5a is a terminal to which a signal OUT for controlling the MOST 3a is applied. At 6a is a terminal to which a signal $\overline{OUT}$ for controlling the MOST 4a is applied, in complementary relation with the signal OUT. A MOST 7a is connected between the terminal 5a and ground, and a MOST 8a is connected between the terminal 6a and ground. A terminal 9a receives a signal CS1 for controlling the MOSTs 7a, 8a.

Terminals 1b–9b in an output circuit 10b for a second semiconductor integrated circuit B correspond to those at 1a–9a in the output circuit 10a for the first semiconductor integrated circuit. At reference numeral 11 is a common output terminal of the output circuits 10a, 10b for the two semiconductor integrated circuits.

Now, the operation of the circuit shown in FIG. 1 will be explained. For convenience of illustration, all of the MOSTs used in the circuit may be taken as n-channel MOSTs.

In the system shown in FIG. 1, in which the output terminals of a plurality of the semiconductor integrated circuits are connected in common with each other, the output state of either one of the selected semiconductor integrated circuits may be present at the output terminal whereas the output state of the other semiconductor integrated circuit is in a non-selected condition and is controlled so as to exert no influence upon the output terminal 11. To this end, MOSTs 7a, 8a and 7b, 8b are provided to render each of the semiconductor integrated circuits selected or non-selected. Chip select signals CS1 and CS2 are transmitted to the respective gates of the MOSTs. Now, for transmission of the output state of only the semiconductor integrated circuit 10a (FIG. 1) from the output terminal 1a thereof to the output terminal 11, the chip select signals CS1 and CS2 are respectively set at "0" and "1". Under such circumstances complementary signals are applied to the terminals 5a, 6a to transmit these signals to the gates of the MOSTs 3a, 4a, presenting a "1" or "0" to the output terminal 1a according to the level of these signals. For instance, if the signal OUT to the terminal 5a and the signal $\overline{OUT}$ to the terminal 6a are "1" and "0", respectively, a "1" is output to the output terminal 1a since the MOST 3a is turned on and the MOST 4a is non-conductive. On the other hand, the MOSTs 7b, 8b conduct as the chip select signal CS2 is set at "1" on the side of the semiconductor integrated circuit B; however, the MOSTs 3b and 4b do not conduct as the gates thereof are grounded, rendering the terminal 1b floating. Accordingly, a signal transmitted to the terminals 5b, 6b is not present at the terminal 1b. If it is desired to transmit the output from the side of the semiconductor integrated circuit B, the chip select signals CS1 and CS2 are set at "1" and "0". According to the system designated as above, control is performed using the chip select signals CS so as to turn off the MOSTs of one output circuit when the other output circuit is actuated. If the other output MOSTs are enabled, interference is caused between the two outputs, causing deterioration of the "1", "0" levels at the terminal 11.

In a system of the class as aforementioned, the output MOSTs on the non-selected side are required to create a discontinuity. On the other hand, the output MOSTs 3, 4 are required to have short channel lengths to increase the switching speed thereof. However, a reduction in the channel lengths of the MOSTs 3, 4 lowers the threshold value of the MOSTs more than required due to the "short channel effect".

In this instance, the MOSTs do not create a discontinuity to the full extent, i.e., the channel is not turned off completely, even if the terminals 5, 6 are grounded so as to maintain the gate voltages of the output MOSTs 3, 4 at the ground level. This phenomenon has been previously discussed by Nishizawa et al. in their article. "A Limitation of Channel Length in Dynamic Memories", Journal of Solid-State Circuits, Vol. SC-15, No. 4, August 1980. The resistance of the MOSTs often amounts to a value of several M$\Omega$—several hundred M$\Omega$.

If 100 output circuits in a non-selected condition are connected to common output terminals, the common resistance amounts to a value of several tens of k$\Omega$—several k$\Omega$ to thus involve an adverse effect upon the output level derived from the output circuit in a selected condition.

SUMMARY OF THE INVENTION

This invention has been provided in light of the above problems. It is an object of the present invention to lower the electric potential of a source electrode of the MOSTs 7, 8 controlled by the chip select signal to a value lower than the earth potential, so as to fully cut off the output MOSTs 3, 4 when in a non-selected condition, to thereby cause no effect on the common output terminals.

DETAILED DESCRIPTION OF THE PREFERRED EMBODIMENTS

Figure 1:
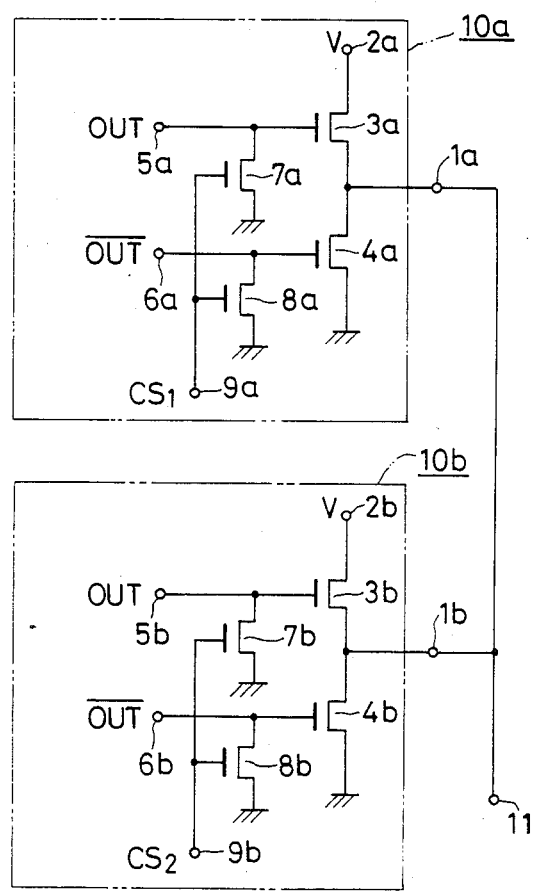
FIG. 1 is a circuit diagram showing essential components of an output circuit of a semiconductor integrated circuit made according to the prior art.

One embodiment of the invention will now be described in the following in conjunction with FIG. 2, wherein the same reference numerals used in FIG. 1 are used to designate the same or corresponding parts. In this connection, it will be noted that the arrangement is made so that the source electrodes of the MOSTs 7, 8 are connected to a voltage generating source generating a predetermined voltage $V_N$ (in this instance, $-V_{TH}$) lower than the ground potential.

Figure 2:
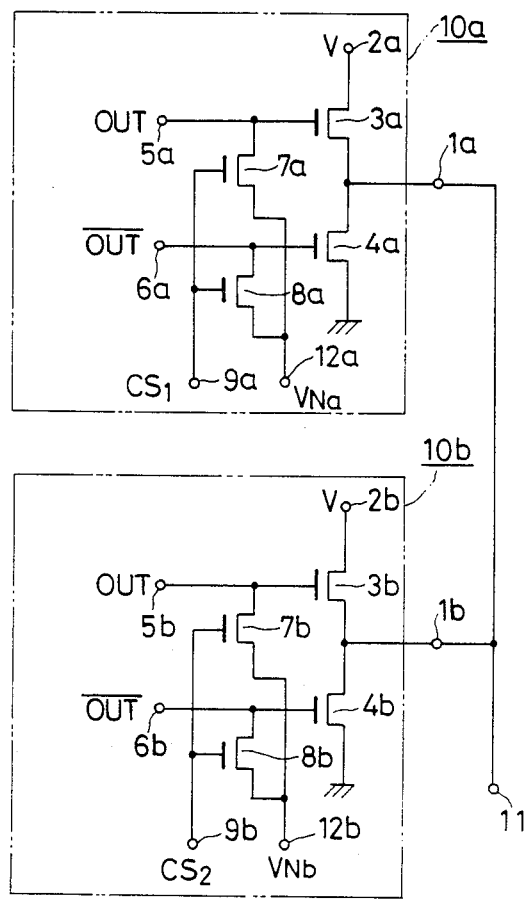
FIG. 2 is a circuit diagram showing essential components of an output circuit of a semiconductor integrated circuit according to one embodiment of the present invention.

Since the basic performance of the circuit shown in FIG. 2 is similar to that shown in FIG. 1, only the differences in performance will be described. The electric potentials of the gate electrodes of the MOSTs 3, 4 (FIG. 2) on the non-selected side amount to $-V_{TH}$ (the threshold voltage of the output MOSTs) lower than the ground level to thus make the output MOSTs completely discontinuous or cut off, thus, presenting no effect at the output terminal 11. However, on the selected side, the chip select signal CS is at "0" so that the MOSTs 7, 8 are opened to some extent for the same reason as the MOSTs 3, 4 on the non-selected side were previously to possibly deteriorate the levels at the terminals 5, 6. In general, the circuit is adapted to supply the CS signal sufficiently faster than the OUT, $\overline{OUT}$ signals. For this reason, the MOSTs 7, 8 are not required to be very quickly actuated as is the case with the MOSTs 3, 4, and thus it is possible to provide these MOSTs with longer channel lengths than those of the MOSTs 3, 4. Further, the threshold voltage value may be intentionally increased by ion injection and the like in the formation of the gate electrodes of these MOSTs to make it possible to create full discontinuity when the chip select signal CS is at "0".

Figure 3:
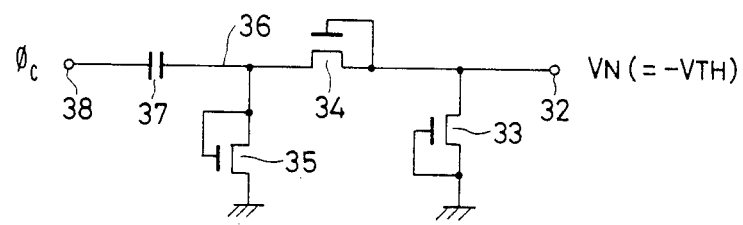
FIG. 3 is a circuit diagram showing one example of a source for generating a predetermined voltage $V_N$ for the embodiment shown in FIG. 2.

A voltage generating source for generating a predetermined potential $V_N$ less than the ground potential as in FIG. 2 will now be explained with reference to FIG. 3.

This voltage generating source may be formed on the same substrate as that of the output circuit. As shown in FIG. 3, 32 is an output terminal for producing the voltage $-V_{TH}$. At 33 is a clamp MOST for setting the output voltage at $-V_{TH}$. This device is connected between the output terminal 32 and ground, with the gate being grounded. A first rectifier MOST 34 has one main electrode and the gate connected to the output terminal 32. A second rectifier MOST 35 has one main electrode connected to the other main electrode of the first rectifier MOST 34 and its own gate, the other main electrode being grounded. At 36 is a rectifier node, 37 being a combined capacitor connected between a terminal 38, to which a clock signal $\phi_c$ is applied, and the other main electrode of the rectifier MOST 34.

How this source is actuated will now be explained. In this connection, the circuit without the clamp MOST 33 is generally well known. The voltage amplitude V of the clock signal $\phi_c$ and a voltage $V_{TH}$ equal to the threshold value of the first and second rectifier MOSTs 34, 35 produce a negative voltage of $-(V-2V_{TH})$ at the output terminal 32 side. As shown in FIG. 3, the clamp MOST 33 is connected to the output 32, and a current flows from the ground point through the clamp MOST 33 when the voltage at the output terminal 32 is more negative than $-V_{TH}$, whereby the voltage at the output terminal 32 is clamped at $-V_{TH}$. That is, a constant voltage $-V_{TH}$ is supplied to the output terminal 32.

Figure 4:
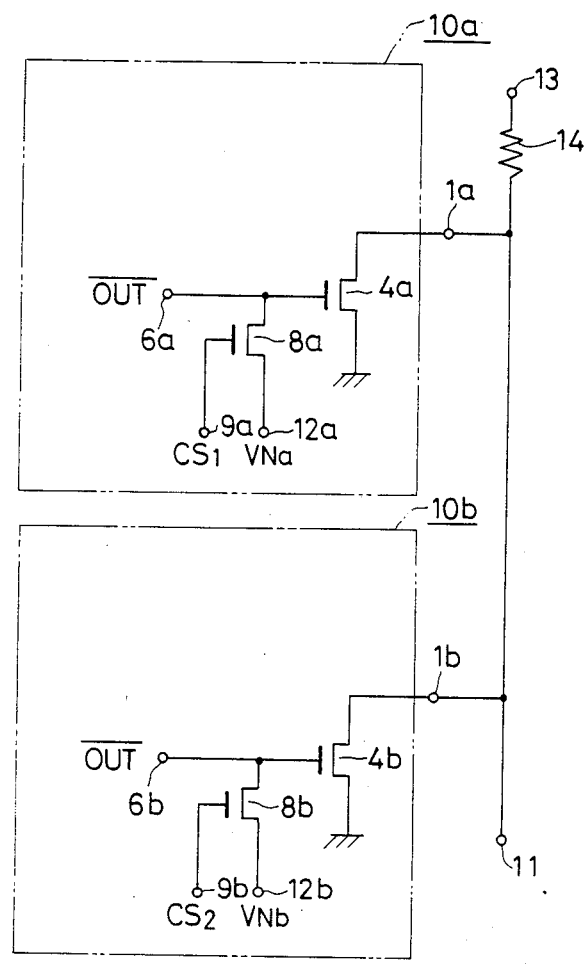
FIG. 4 is a circuit diagram of the essential components of an output circuit of a semiconductor integrated circuit according to another embodiment of the invention.

FIG. 4 is a circuit diagram showing another embodiment of the invention, wherein like reference numerals designate like or corresponding parts. This circuit may be produced by eliminating from each of the output circuits 10a, 10b a circuit (composed of the MOSTs 3, 7) on the pull up side, and by providing a common pull up resistor 14 between the output terminal 11 and a power source terminal 13. This produces an output circuit system of the so-called "open drain output" type. The circuit as shown is actuated in the same manner as in FIG. 2. As is readily suggested from the performance of the circuit in FIG. 2, the "1" level at the output terminal 11 is prevented from being lowered by making the output MOST 4 in the non-selected condition fully discontinuous or cut off.

Although the device as described hereinabove refers to the instance wherein an n-channel MOST is employed, the invention is also applicable to the case where a p-channel MOST is used.

As above set forth, according to the present invention, the output circuit is constructed so that the control MOST is connected between a low potential point and the gate of the output MOST for powering either of the binary logic voltages in response to the gate output and so that the control voltage supplied to the gate of the control MOST makes the output MOST discontinuous, with the electric potential of the aforementioned low potential point being made lower than the value of the binary logic voltages. As a result, it is possible to make the output MOST fully cut off or discontinuous if required, but no interference is involved between the outputs even if a plurality of such output MOSTs are used in parallel with each other.

What is claimed is:

1. An output circuit responsive to a control signal for selectively providing an output signal at its output terminal in accordance with an input logic signal, said circuit comprising:
    a first field effect transistor having first, second, and third terminals and conducting between its first and second terminals in accordance with a potential applied to its third terminal, said third terminal comprising a gate electrode for receiving a voltage corresponding to said input logic signal, said second terminal being coupled to a relatively low voltage point and said first terminal being coupled to an output terminal of said output circuit;
    a voltage generating source for providing a potential lower than a potential at said low voltage point; and
    a second insulated gate field effect transistor having first, second, and third terminals and conducting between its first and second terminals in accordance with a potential applied to its third terminal, said third terminal of said second transistor comprising a gate electrode for receiving said control signal, said second terminal of said second transistor being coupled to said voltage generating source and said first terminal of said second transistor being coupled to said gate electrode of said first transistor,
    a channel length of said first transistor being shorter than a channel length of said second transistor.

2. An output circuit as claimed in claim 1, said voltage generating source comprising a capacitance means and a plurality of field effect transistors, each transistor including first, second, and third terminals and conducting between its first and second terminals in accordance with a potential at its third terminal, the third terminal of each said transistor comprising a gate electrode, said plurality of field effect transistors comprising:

a first rectifier field effect transistor having its second and third terminals connected to said lower voltage point and its first terminal connected to a terminal to which a clock signal is applied through said capacitance means;

a second rectifier field effect transistor having its second and third terminals connected to said first terminal of said first rectifier field effect transistor and its first terminal connected to a low-level voltage point; and a clamp field effect transistor having its first terminal connected to said lower voltage point and its second and third terminals connected to a low-level voltage point.

3. An output circuit responsive to a control signal for selectively providing an output signal at its output terminal in accordance with an input logic signal, said circuit including a first plurality of field effect transistors, each of said transistors having first, second, and third terminals, each of said transistors conducting between its first and second terminals in accordance with a potential applied to its third terminal, the third terminal of each of said transistors comprising a gate electrode, said circuit including a first low potential point, a second low potential point, and a voltage generating source for providing a lower potential to said second low potential point than exists at said first low potential point, said plurality of field effect transistors comprising:

a first field effect transistor connected between an output terminal and said first low potential point and to which a first control signal is applied to its third terminal;

a second field effect transistor having its first terminal connected to said third terminal of said first transistor and its second terminal connected to said second low potential point, a second control signal being supplied to its third terminal;

a pull up field effect transistor connected between a relatively high voltage point and said output terminal and to which a signal in complementary relation with said first control signal applied to said third terminal of said first transistor is applied to its third terminal; and a third field effect transistor connected between said third terminal of said pull up transistor and said second low potential point and to which said second control signal supplied to said third terminal of said second transistor is supplied to its third terminal.

4. An output circuit as claimed in claim 3, said voltage generating source comprising a capacitance means and a second plurality of field effect transistors, each transistor including first, second, and third terminals and conducting between its first and second terminals in accordance with a potential at its third terminal, the third terminal of each said transistor comprising a gate electrode, said second plurality of field effect transistors comprising:

a first rectifier field effect transistor having its second and third terminals connected to said second low potential point and its first terminal connected to a terminal to which a clock signal is applied through said capacitance means;

a second rectifier field effect transistor having its second and third terminals connected to said first terminal of said first rectifier field effect transistor and its first terminal connected to a low-level voltage point; and a clamp field effect transistor having its first terminal connected to said second low potential point and its second and third terminals connected to a low-level voltage point.

5. An output circuit as claimed in claim 3, wherein channel lengths of said first transistor and said pull up transistor are shorter than channel lengths of said second and third transistors.

6. An output circuit system in which the output terminals of output circuit components of a plurality of semiconductor integrated circuits are connected in common with each other, these common terminals serving as output terminals of the system, said system including a voltage generating source, each of the output circuit components of said plurality of semiconductor integrated circuits including a first plurality of field effect transistors, each of said transistors having first, second, and third terminals, each of said transistors conducting between its first and second terminals in accordance with a potential applied to its third terminal, said third terminal of each of said transistors comprising a gate electrode, said first plurality of field effect transistors comprising:

a first transistor having its first electrode connected to the output terminals of said system, which is connected by a load element to a relatively high voltage point, and its second electrode connected to a relatively low voltage point, logic voltage being supplied to its third terminal; and a second transistor having its first terminal connected to said third terminal of said first transistor and its second electrode connected to a voltage point lower than said relatively low voltage point, a chip select signal being supplied to its third terminal.

7. An output circuit as claimed in claim 6, said voltage generating source comprising a capacitance means and a second plurality of field effect transistors, each transistor including first, second, and third terminals and conducting between its first and second terminals in accordance with a potential at its third terminal, the third terminal of each said transistor comprising a gate electrode, said second plurality of field effect transistors comprising:

a first rectifier field effect transistor having its second and third terminals connected to said lower voltage point and its first terminal connected to a terminal to which a clock signal is applied through said capacitance means;

a second rectifier field effect transistor having its second and third terminals connected to said first terminal of said first rectifier field effect transistor and its first terminal connected to a low-level voltage point; and a clamp field effect transistor having its first terminal connected to said lower voltage point and its second and third terminals connected to a low-level voltage point.

8. An output circuit as claimed in claim 6, wherein a channel length of said first transistor is shorter than a channel length of said second transistor.

* * * * *